(12) United States Patent
Lim

(10) Patent No.: US 12,029,092 B2
(45) Date of Patent: Jul. 2, 2024

(54) DISPLAY APPARATUS INCLUDING GAP IN LIGHT EMITTING LAYER

(71) Applicant: LG Display Co., Ltd., Seoul (KR)

(72) Inventor: Hyeongjun Lim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 303 days.

(21) Appl. No.: 17/559,142

(22) Filed: Dec. 22, 2021

(65) Prior Publication Data
US 2022/0208885 A1    Jun. 30, 2022

(30) Foreign Application Priority Data
Dec. 31, 2020  (KR) .......................... 10-2020-0189675

(51) Int. Cl.
*H10K 59/35* (2023.01)
*H10K 50/818* (2023.01)

(52) U.S. Cl.
CPC ......... *H10K 59/353* (2023.02); *H10K 50/818* (2023.02)

(58) Field of Classification Search
None
See application file for complete search history.

(56) References Cited

U.S. PATENT DOCUMENTS

2021/0202610 A1* 7/2021 Ryu ..................... H10K 50/858

\* cited by examiner

*Primary Examiner* — Suberr L Chi
(74) *Attorney, Agent, or Firm* — Birch, Stewart, Kolasch & Birch, LLP

(57) ABSTRACT

Discussed is a display apparatus including a substrate having a plurality of subpixels, an insulating layer provided on the substrate, a first electrode provided on the insulating layer, a light emitting layer provided on the insulating layer and the first electrode, and a second electrode provided on the light emitting layer. The substrate can include a left portion including one edge, a right portion including another edge, and a central portion interposed between the left portion and the right portion. Further, a first fence and a second fence are provided on the insulating layer between adjacent subpixels, a gap is inside the light emitting layer between adjacent subpixels, a trench is provided in the insulating layer between the first fence and the second fence, and the gap overlaps the trench.

19 Claims, 13 Drawing Sheets

(a)

(b)

DISPLAY APPARATUS INCLUDING GAP IN LIGHT EMITTING LAYER

CROSS-REFERENCE TO RELATED APPLICATIONS

This application claims the priority benefit of the Korean Patent Application No. 10-2020-0189675 filed in the Republic of Korea on Dec. 31, 2020, the entire contents of which are hereby expressly incorporated by reference as if fully set forth herein into the present application.

BACKGROUND

Field of the Invention

The present disclosure relates to a display apparatus.

Discussion of the Background Art

With the development of the information society, demand for display apparatuses for displaying an image has increased in various forms. Accordingly, various display apparatuses such as liquid crystal displays (LCDs), plasma display panels (PDPs), and organic light emitting displays (OLEDs) have recently been used.

Among the display apparatuses, an organic light emitting display apparatus is a self-luminous type display apparatus, which has superior viewing angle and contrast ratio compared to an LCD, is lightweight and thin because it does not require a separate backlight, and is advantageous in power consumption. In addition, the organic light emitting display apparatus can be driven with a low DC voltage, can have a fast response speed, and can incur low manufacturing costs.

In the organic light emitting display apparatus, light generated by a light emitting device can be emitted in a vertical direction, and thus, a partial amount of light emitted from an outer region of a panel does not pass through a color filter, which can reduce luminance efficiency of the display panel.

SUMMARY OF THE DISCLOSURE

Accordingly, the present disclosure is directed to providing a display apparatus that substantially obviate one or more problems due to limitations and disadvantages of the related art.

An aspect of the present disclosure is directed to providing a display apparatus having improved light efficiency by controlling a path of light.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate having a plurality of subpixels, an insulating layer provided on the substrate, a first electrode provided on the insulating layer, a light emitting layer provided on the insulating layer and the first electrode, and a second electrode provided on the light emitting layer, wherein the substrate includes a left portion including one edge, a right portion including the other edge, and a central portion interposed between the left portion and the right portion, a first fence and a second fence are provided on the insulating layer between adjacent subpixels, a void is inside the light emitting layer between adjacent subpixels, a trench is provided in the insulating layer between the first fence and the second fence, and the void overlaps the trench.

In another aspect of the present disclosure, there is provided a display apparatus including a substrate having a left portion, a right portion, and a central portion between the left portion and the right portion, a plurality of subpixels including a first subpixel and a second subpixel provided in the same array in each of the left portion, the right portion, and the central portion, a first trench provided between the first subpixel and the second subpixel provided in the left portion, a second trench provided between the first subpixel and the second subpixel provided in the central portion, and a third trench provided between the first subpixel and the second subpixel provided in the right portion, wherein the first trench is located to be closer to the second subpixel than the first subpixel provided in the left portion, the second trench is located in the center between the first subpixel and the second subpixel provided in the central portion, and the third trench is located to be closer to the first subpixel than the second subpixel provided in the right portion.

In another aspect of the present disclosure, there is provided a display apparatus including a substrate including a left portion, a right portion, and a central portion between the left portion and the right portion, a plurality of subpixels including a first subpixel and a second subpixel provided in the same array in each of the left portion, the right portion, and the central portion, an insulating layer provided on the substrate, a trench provided in the insulating layer between the first subpixel and the second subpixel, a light emitting layer provide on the insulating layer including a charge generating layer, and a gap provided in a region overlapping the trench of the light emitting layer, so that the charge generating layer is disconnected at the gap, wherein, in the left portion and the right portion, the gap is closer to a subpixel among the first subpixel and the second subpixel which is closer to the central portion, and an end of the gap is bent toward the central portion.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
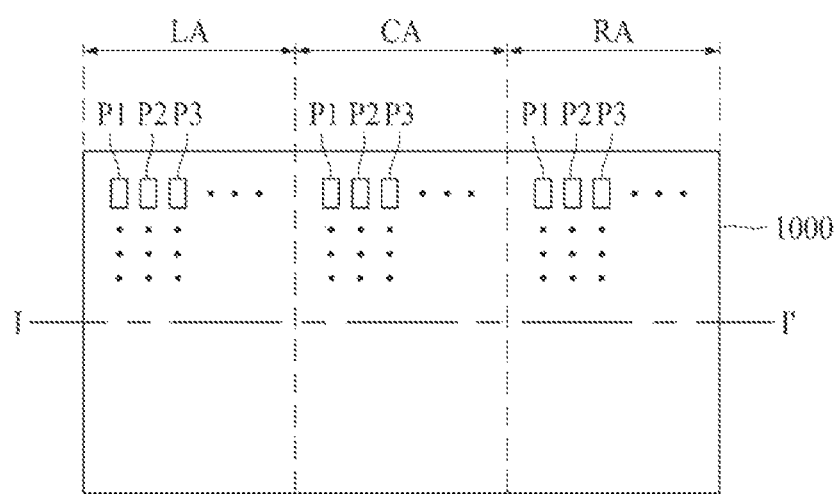
FIG. 1 is a schematic plan view showing an example of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, e.g., when a position relation between two parts is described as 'on~', 'over~', 'under~', and 'next~', one or more other parts can be disposed between the two parts unless 'just' or 'direct' is used.

In describing a time relationship, e.g., when the temporal order is described as 'after~', 'subsequent~', 'next~', and 'before~', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings.

FIG. 1 is a schematic plan view showing an example of a display apparatus according to an embodiment of the present disclosure. All the components of each display apparatus according to all embodiments of the present disclosure are operatively coupled and configured.

Referring to FIG. 1, a display apparatus 1000 includes a left portion LA including one edge of a display region of the display apparatus 1000 or a display panel, a right portion RA including another edge of the display region, and a central portion CA disposed between the left portion LA and the right portion RA. The left portion LA, the right portion RA, and the center portion CA constitute the display region of the display apparatus 1000, and each of the left portion LA, the right portion RA, and the center portion CA includes a plurality of subpixels P1, P2, and P3. Specifically, the first subpixel P1 is provided to emit light of a first color, the second subpixel P2 is provided to emit light of a second color, and the third subpixel P3 is provided to emit light of a third color. Each of the subpixels P1, P2, and P3 can be provided in the same arrangement in each of the left portion, the right portion, and the central portion. Further, the plurality of subpixels can be arranged in a matrix configuration or other suitable configuration.

Figure 2:
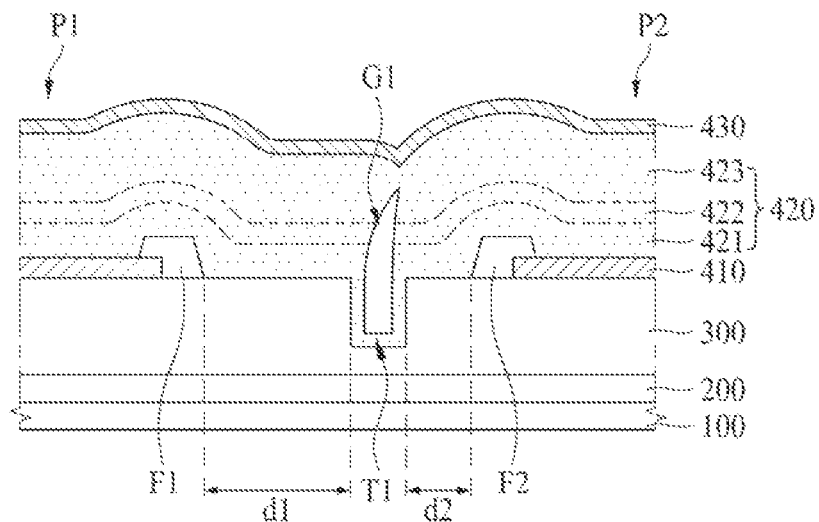
FIG. 2 is a schematic cross-sectional view of an organic light emitting display apparatus showing an example of a portion of a left portion in a region I-I' of FIG. 1.

FIG. 2 is a schematic cross-sectional view of an organic light emitting display apparatus showing an example of a portion of the left portion LA in region I-I' of FIG. 1, and for convenience, two adjacent subpixels P1 and P2 and a boundary region thereof are illustrated.

As can be seen from FIG. 2, the display apparatus according to an embodiment of the present disclosure includes a substrate 100, a circuit element layer 200, an insulating layer 300, fences F1 and F2, a first electrode 410, a light emitting layer 420, and a second electrode 430.

The substrate 100 can be formed of glass or plastic, but is not limited thereto, and can be formed of a semiconductor material such as a silicon wafer. A plurality of subpixels P1 and P2 are provided on the substrate 100.

The display apparatus according to the first embodiment of the present disclosure can be formed in a so-called top emission mode in which emitted light is emitted upward. Accordingly, as a material of the substrate 100, not only a transparent material but also an opaque material can be used.

The circuit element layer 200 is formed on the substrate 100. In the circuit element layer 200, circuit elements including various signal lines, thin film transistors (TFTs), and capacitors are provided for each subpixel P1 and P2. The signal lines can include a gate line, a data line, a power line, and a reference line, and the TFT can include a switching TFT, a driving TFT, and a sensing TFT.

The switching TFT is switched according to a gate signal supplied to the gate line and serves to supply a data voltage supplied from the data line to the driving TFT.

The driving TFT is switched according to a data voltage supplied from the switching TFT to generate a data current from power supplied from the power line and supply the generated data current to the first electrode 410.

The sensing TFT serves to sense a threshold voltage deviation of the driving TFT that causes image quality degradation, and in response to a sensing control signal supplied from the gate line or a separate sensing line, the sensing TFT supplies a current from the driving TFT to the reference line.

The capacitor serves to maintain a data voltage supplied to the driving TFT for one frame and is connected to a gate terminal and a source terminal of the driving TFT.

The insulating layer 300 is formed on the circuit element layer 200. The insulating layer 300 can be formed of an organic film such as acrylic resin, epoxy resin, phenolic resin, polyamide resin, polyimide resin, etc. Alternatively, the insulating layer 300 can be formed of an inorganic layer such as silicon nitride, aluminum nitride, zirconium nitride, titanium nitride, hafnium nitride, tantalum nitride, silicon oxide, aluminum oxide, or titanium oxide.

A first trench T1 is provided in a boundary region between the two subpixels P1 and P2. The first trench T1 can be provided in the insulating layer 300 between the first fence F1 and the second fence F2 and can extend to a certain region in the insulating layer 300 without penetrating through the insulating layer 300. However, the present disclosure is not limited thereto, and the first trench T1 can penetrate through the insulating layer 300 and extend to a certain region inside the circuit element layer 200 therebelow.

The first and second fences F1 and F2 are formed in a matrix structure in the boundary region between the two subpixels P1 and P2 and cover both ends of the first electrode 410 provided in the subpixels P1 and P2. Accordingly, an exposed region of the first electrode 410 exposed and not covered by the first and second fences F1 and F2 is a light emitting region.

In addition, since the first and second fences F1 and F2 are formed to cover a portion of an upper surface and a side surface of the end of the first electrode 410, a problem in which current is concentrated on the end of the first electrode 410 and luminous efficiency is degraded can be prevented. In addition, the first and second fences F1 and F2 can be formed of an inorganic insulating layer, but are not limited thereto, and can be formed of an organic insulating layer.

The first fence F1 is formed to be spaced apart by a first interval d1 from one side, e.g., a left end of the first trench T1, and the second fence F2 is formed to be spaced apart by a second interval d2 from the other side, e.g., a right end of the first trench T1. Here, as shown in FIG. 2, when the second fence F2 is located closer to the central portion CA of the display apparatus 1000 than the first fence F1, a size of the second interval d2 can be less than a size of the first interval d1. Also, the first trench T1 can be located closer to the end of the first electrode 410 provided in the second subpixel P2 than the end of the first electrode 410 provided in the first subpixel P1. For example, the first trench T1 can be located closer to the second subpixel P2 than to the first subpixel P1.

The first electrode 410 is provided on the insulating layer 300. The first electrode 410 is patterned for each subpixel P1 and P2 and can function as an anode of the display apparatus. The first electrode 410 is connected to the driving TFT provided in the circuit element layer 200. Also, a height of the first electrode 410 can be lower than heights of the first and second fences F1 and F2.

The light emitting layer 420 is formed on the insulating layer 300, the first and second fences F1 and F2, and the first electrode 410. For example, the light emitting layer 420 is formed in both the subpixels P1 and P2 and the boundary region between the two subpixels P1 and P2.

The light emitting layer 420 can be provided to emit white W light. To this end, the light emitting layer 420 can include a plurality of stacks that emit light of different colors. Specifically, the light emitting layer 420 can include a first stack 421, a second stack 423, and a charge generating layer CGL 422 provided between the first stack 421 and the second stack 423.

The first stack 421 can include a hole injection layer, a first hole transport layer, a first organic light emitting layer, and a first electron transport layer being sequentially stacked, the second stack 423 can include a second hole transport layer, a second organic light emitting layer, a second electron transport layer, and an electron injection layer, and the charge generating layer 422 can include an N-type charge generating layer for supplying electrons to the first stack 421 and a P-type charge generating layer for supplying holes to the second stack 423.

The light emitting layer 420 is formed inside and above the first trench T1. When the light emitting layer 420 is formed inside the first trench T1, at least a portion of the light emitting layer 420 can be disconnected, thereby preventing a leakage current between the adjacent subpixels P1 and P2.

The first stack 421 can be formed on a side surface and a lower surface in the first trench T1. In this case, at least a portion of the first stack 421 can be disconnected without being continuous in the first trench T1. For example, at least one of the hole injection layer, the first hole transport layer, the first organic light emitting layer, and the first electron transport layer constituting the first stack 421 can be disconnected in the first trench T1. A portion of the first stack 421 can be continuous in the first trench T1. For example, some of the hole injection layer, the first hole transport layer, the first organic light emitting layer, and the first electron transport layer constituting the first stack 421 can be formed to be continuous on the side surface and the lower surface of the first trench T1.

The charge generating layer 422 is provided on the first stack 421. In this case, the charge generating layer 422 can be disconnected from the inside of the first trench T1 or in a region overlapping the first trench T1. Accordingly, charges cannot move through the charge generating layer 422 between the subpixels P1 and P2 disposed adjacent to each other with the first trench T1 therebetween.

The second stack 423 can be continuous without being disconnected between the subpixels P1 and P2 disposed adjacent to each other with the first trench T1 therebetween on the charge generating layer 422. Accordingly, charges can move through the second stack 423 between the subpixels P1 and P2 disposed adjacent to each other with the first trench T1 therebetween.

In this case, a thickness of the second stack 423 overlapping the first trench T1 region can be less than a thickness of the second stack 423 not overlapping the first trench T1 region. Specifically, since the second stack 423 is deposited to be spaced apart from each other on the upper surfaces of the left and right charge generating layers 422 with the first trench T1 therebetween, and then contact each other, and thus, a portion of the lower surface of the second stack 423 can be disconnected above the first trench T1. For example, at least one of the second hole transport layer, the second organic light emitting layer, and the second electron transport layer constituting the second stack 423 can be disconnected in a region overlapping the first trench T1.

Due to the structures of the first stack 421, the charge generating layer 422, and the second stack 423 described above, a first gap G1 is provided in the light emitting layer 420. Specifically, the first gap G1 can be provided inside the first trench T1 and can extend to an upper portion of the first trench T1. In this case, the end of the first gap G1 is formed at a position higher than the charge generating layer 422, so that the charge generating layer 422 can be disconnected on the first trench T1 by the first gap G1. In addition, a width of the first gap G1 can be formed to decrease from the bottom to the top of the first gap G1, and the end of the first gap G1 can be bent toward a region in which the second fence F2 is provided, for example, toward the central portion CA of the display apparatus 1000. Accordingly, light emitted from the light emitting layer 420 provided in the first and second subpixels P1 and P2 can be totally reflected from a side surface of the first gap G1 and emitted in the direction of the second subpixel P2 which is a direction in which the end of the first gap G1 faces. For example, light efficiency of the display apparatus can be improved.

The second electrode 430 is formed on the second stack 423. The second electrode 430 can function as a cathode of the display apparatus. Like the light emitting layer 420, the second electrode 430 is formed in both the two subpixels P1 and P2 and the boundary region between the two subpixels P1 and P2. Since the second stack 423 is not disconnected, the second electrode 430 can be stably deposited on the light emitting layer 420.

Since the display apparatus according to the first embodiment of the present disclosure is formed in a top emission mode, the second electrode 430 can be formed of a transparent metal material such as indium tin oxide (ITO) or indium zinc oxide (IZO) so that light emitted from the light emitting layer 420 can be transmitted upward. In addition, the second electrode 430 can be formed of a single layer or multiple layers.

Figure 3:
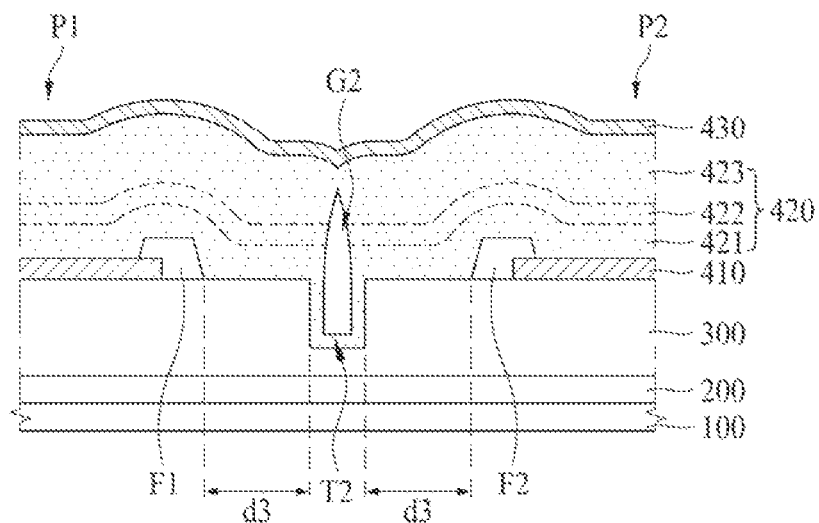
FIG. 3 is a schematic cross-sectional view of an organic light emitting display apparatus showing an example of a portion of a central portion in a region I-I' of FIG. 1.

FIG. 3 is a schematic cross-sectional view of an organic light emitting display apparatus showing an example of a portion of the central portion CA in region I-I' of FIG. 1, in which the structure of the insulating layer 300 and the light emitting layer 420 is changed. Hereinafter, only a different configuration will be described or focused.

Referring to FIG. 3, a second trench T2 is provided in a boundary region between the two subpixels P1 and P2.

The second trench T2 can be provided in the insulating layer 300 between the first fence F1 and the second fence F2 and can extend to a certain area of the insulating layer 300 or can extend to a certain region of the circuit element layer 200 through the insulating layer 300. Specifically, the first fence F1 is formed to be spaced apart by a third interval d3 from one end of the second trench T2, and the second fence F2 is formed to be spaced apart by a third interval d3, which is the same interval, from the other end of the second trench T2. For example, a distance by which the first fence F1 is spaced apart from one end of the second trench T2 and a distance by which the second fence F2 is spaced apart from the other end of the second trench T2 can be the same. In addition, the second trench T2 can be located in the center between the end of the first electrode 410 provided in the first subpixel P1 and the end of the first electrode 410 provided in the second subpixel P2. For example, the second trench T2 can be located in the center between the first subpixel P1 and the second subpixel P2.

The light emitting layer 420 can be formed on the insulating layer 300, the first and second fences F1 and F2, and the first electrode 410 and can include the first stack 421, the charge generating layer 422, and the second stack 423. Similar to the case of FIG. 2 described above, at least a portion of the first stack 421 may not be continuous and can be disconnected in the second trench T2, and in some cases, a portion of the first stack 421 can be continuous in the trench T2. Also, the charge generating layer 422 can be disconnected inside the second trench T2 or in a region overlapping the second trench T2. Also, the second stack 423 can be continuous without being disconnected between the subpixels P1 and P2 disposed adjacent to each other with the second trench T2 therebetween. In this case, a thickness of the second stack 423 overlapping the second trench T2 region can be less than a thickness of the second stack 423 not overlapping the second trench T2 region.

Accordingly, due to the structure of the first stack 421, the charge generating layer 422, and the second stack 423, the second gap G2 is provided in the light emitting layer 420. Specifically, the second gap G2 can be provided in the second trench T2 and can extend upwards of the second trench T2. In this case, the end of the second gap G2 is formed at a position higher than the charge generating layer 422, so that the charge generating layer 422 can be disconnected on the second trench T2 due to the second gap G2. In addition, a width of the second gap G2 can decrease from the bottom to the top of the second gap G2, and the second gap G2 can be formed in a vertical direction. Accordingly, light emitted from the light emitting layer 420 provided in the first and second subpixels P1 and P2 is not affected by the second gap G2 and is emitted in a vertical direction toward the central portion CA. For example, light efficiency of the display apparatus can be improved.

Figure 4:
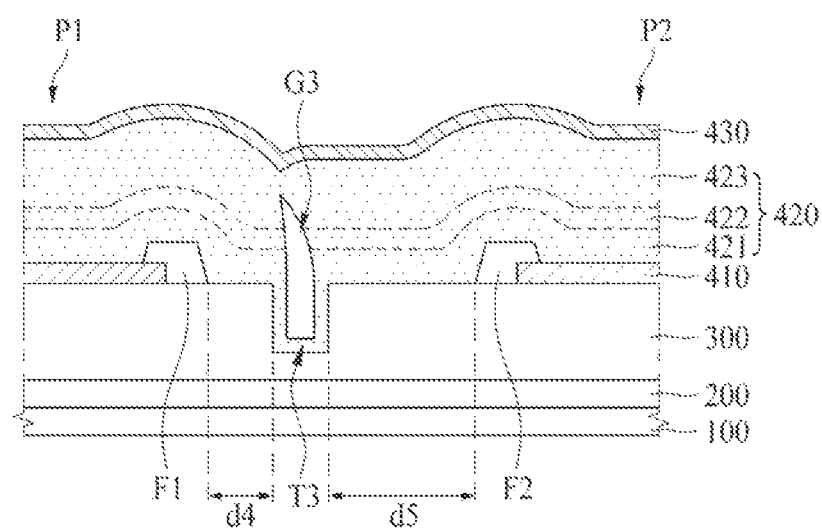
FIG. 4 is a schematic cross-sectional view of an organic light emitting display apparatus showing an example of a portion of a right portion in a region I-I' of FIG. 1.

FIG. 4 is a schematic cross-sectional view of an organic light emitting display apparatus showing an example of a portion of the right portion RA in region I-I' of FIG. 1, in which the structure of the insulating layer 300 and the light emitting layer 420 in the display apparatus of FIG. 2 described above is changed. Hereinafter, only a different configuration will be described or focused.

Referring to FIG. 4, a third trench T3 is provided in a boundary region between the two subpixels P1 and P2.

The third trench T3 can be provided in the insulating layer 300 between the first fence F1 and the second fence F2, and extend to a certain region of the insulating layer 300 or can extend to a certain region of the circuit element layer 200 through the insulating layer 300. Specifically, the first fence F1 is formed to be spaced apart by a fourth interval d4 from one end of the third trench T3, and the second fence F2 is formed to be spaced apart by a fifth interval d5 from the other end of the third trench T3. Here, as shown in FIG. 4, when the first fence F1 is located closer to the central portion CA of the display apparatus 1000 than the second fence F2, a size of the fourth interval d4 can be less than a size of the fifth interval d5. Also, the third trench T3 can be located closer to the end of the first electrode 410 provided in the first subpixel P1 than to the end of the first electrode 410 provided in the second subpixel P2. For example, the third trench T3 can be located closer to the first subpixel P1 than to the second subpixel P2.

The light emitting layer 420 can be formed on the insulating layer 300, the first and second fences F1 and F2, and the first electrode 410 and can include the first stack 421, the charge generating layer 422 and the second stack 423 described above. Similar to the case of FIG. 2 described above, at least a portion of the first stack 421 may not be continuous and disconnected in the third trench T3, and in some cases, a portion of the first stack 421 can be continuous in the third trench T3. Also, the charge generating layer 422 can be disconnected inside the third trench T3 or in a region overlapping the third trench T3. Also, the second stack 423 can be continuous without being disconnected between the subpixels P1 and P2 disposed adjacent to each other with the third trench T3 interposed therebetween. In this case, a thickness of the second stack 423 overlapping the third trench T3 region can be less than a thickness of the second stack 423 not overlapping the third trench T3 region.

Accordingly, due to the structure of the first stack 421, the charge generating layer 422, and the second stack 423, the third gap G3 can be provided in the light emitting layer 420. Specifically, the third gap G3 can be provided in the third trench T3 and can extend up to an upper side of the third trench T3. In this case, the end of the third gap G3 is formed at a position higher than the charge generating layer 422, so that the charge generating layer 422 can be disconnected on the third trench T3 due to the third gap G3. In addition, the width of the third gap G3 can be formed to decrease from the bottom to the top of the third gap G3, and the end of the third gap G3 can be formed to be bent toward a region in which the first fence F1 is provided, for example, toward the central portion CA of the display apparatus 1000. Accordingly, light emitted from the light emitting layer 420 provided in the first and second subpixels P1 and P2 can be totally reflected from the side surface of the third gap G3 and can be emitted in the direction of the first subpixel P1, which is a direction in which the end of the third gap G3 faces. For example, light efficiency of the display apparatus can be improved.

An encapsulation layer and a color filter can be provided on the second electrode 430.

As a result, in the present disclosure, by disconnecting the charge generating layer 422 in the boundary region between the adjacent subpixels P1 and P2 through the gaps G1 to G3 provided in the light emitting layer 420, an occurrence of a lateral leakage current flowing in the boundary region between the adjacent subpixels P1 and P2 can be prevented.

Specifically, the charge generating layer 422 has conductivity higher than the first stack 421 and the second stack 423. In particular, since the N-type charge generating layer constituting the charge generating layer 422 can include a metal material, conductivity thereof is higher than that of the first stack 421 and the second stack 423. For example, charges between the subpixels P1 and P2 disposed adjacent to each other can be mainly transferred through the charge generating layer 422, and the amount of transfer of charges through the second stack 423 is insignificant. Therefore, by forming the charge generating layer 422 to be disconnected inside the first to third trenches T1 to T3, the transfer of charges between the subpixels P1 and P2 disposed adjacent to each other can be reduced to thereby prevent an occurrence of a leakage current.

Also, according to the present disclosure, in the display apparatus 1000, each of the first to third gaps G1 to G3 is formed in a different shape, so that light efficiency of the display apparatus can be improved. Specifically, the ends of the gaps G1 to G3 can be bent toward the center of the display apparatus 1000 or can be formed in a vertical direction. Accordingly, since light emitted from the light emitting layer 420 is totally reflected from the surfaces of the gap G1 to G3, a path of the light emitted from the light emitting layer 420 can be adjusted so that the light emitted from the light emitting layer 420 is directed toward the center of the display apparatus 1000, thereby improving light efficiency of the display apparatus.

FIGS. 5A to 5D are cross-sectional views illustrating a process of forming a display apparatus according to an embodiment of the present disclosure.

Figure 5A:
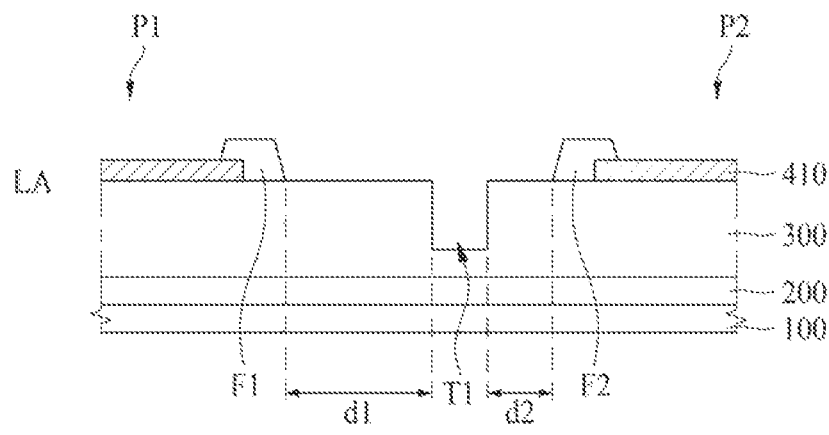
FIGS. 5A to 5D are cross-sectional views illustrating a process of forming a display apparatus according to an embodiment of the present disclosure.
Figure 5A:
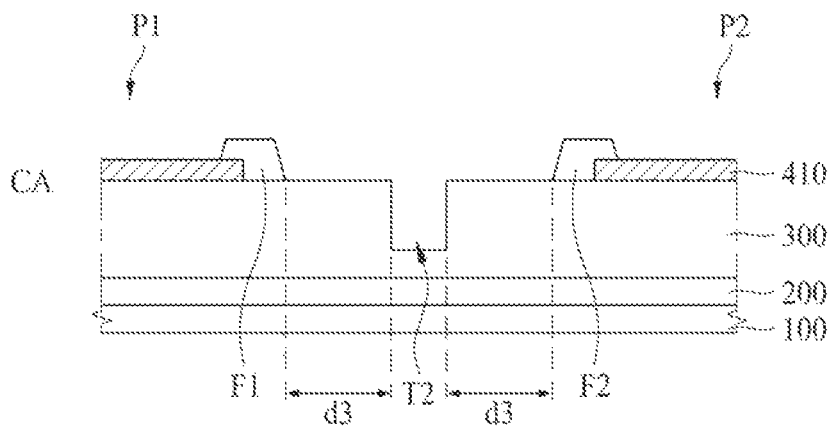
Figure 5A:
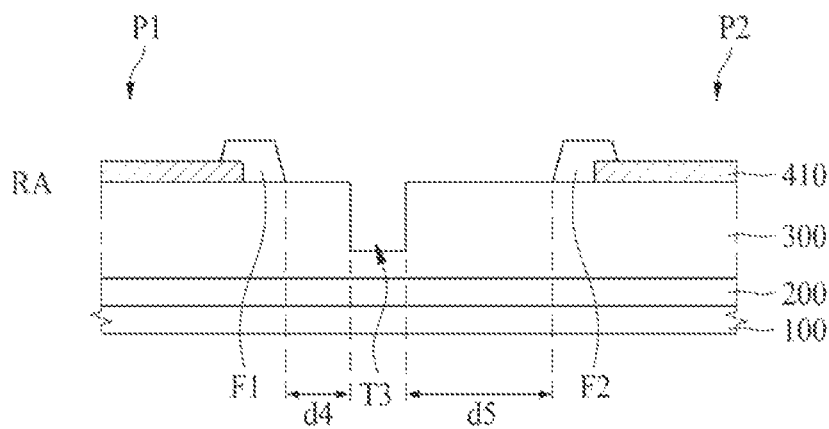

Referring to FIG. 5A, the first electrode 410 is formed on the insulating layer 300, the first to third trenches T1 to T3 are formed in the insulating layer 300, and first and second fences F1 and F2 are formed on the insulating layer 300 and the first electrode 410. Specifically, the first electrode 410 is patterned on the insulating layer 300 in the first and second subpixels P1 and P2. In addition, the first to third trenches T1 to T3 are formed by etching the insulating layer 300 in a region between the first and second subpixels P1 and P2. In addition, first and second fences F1 and F2 are formed on the insulating layer 300. As described above, the first and second fences F1 and F2 are formed to cover both ends of the first electrode 410.

Here, as described above, in the left portion LA, the first trench T1 can be located closer to the end of the first electrode 410 provided in the second subpixel P2 than to the end of the first electrode 410 provided in the first subpixel P1. In addition, since the size of the second interval d2 is less than the size of the first interval d1, the second fence F2 is formed closer to the first trench T1 than the first fence F1.

As described above, in the central portion CA, the second trench T2 can be located in the center between the end of the first electrode 410 provided in the first subpixel P1 and the end of the first electrode 410 provided in the second subpixel P2. In addition, the first fence F1 and the second fence F2 are formed to be spaced apart by the same distance from the second trench T2.

Also, as described above, in the right portion RA, the third trench T3 can be located closer to the end of the first electrode 410 provided in the first subpixel P1 than to the end of the first electrode 410 provided in the second subpixel P2. In addition, since a size of the fourth interval d4 is less than a size of the fifth interval d5, the first fence F1 is formed closer to the third trench T3 than the second fence F2.

Figure 5B:
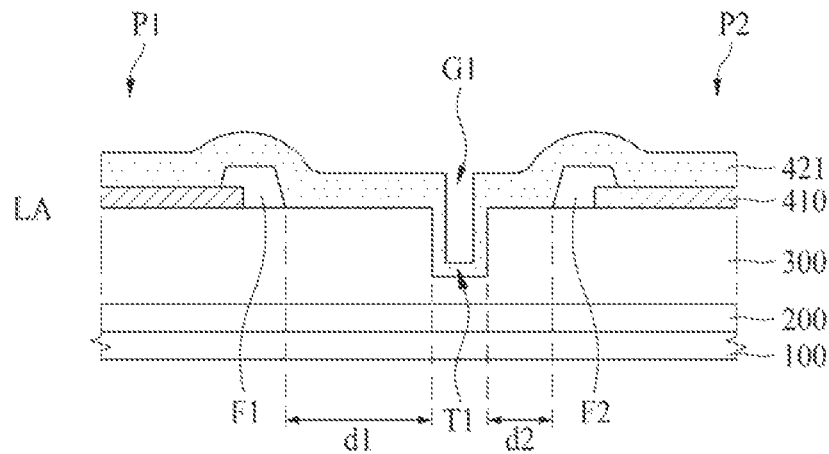
Figure 5B:
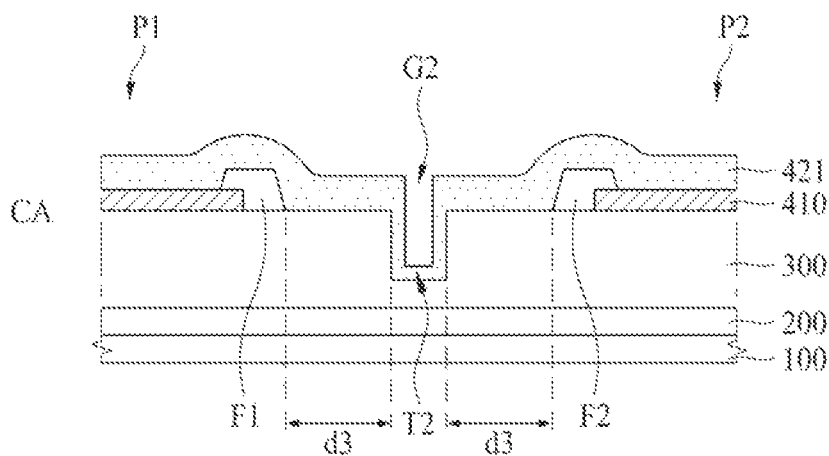
Figure 5B:
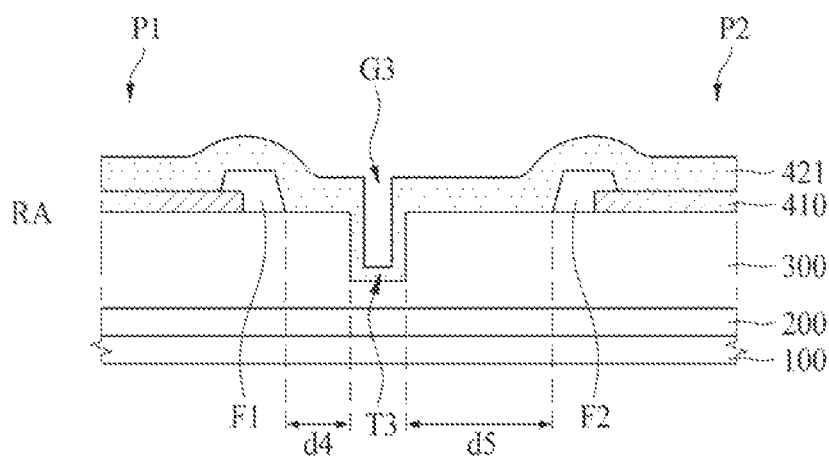

Referring to FIG. 5B, a first stack 421 is formed on the insulating layer 300 and the first electrode 410. The first stack 421 can be formed through a deposition process and can also be formed on inner side surfaces and lower surfaces of the first to third trenches T1 to T3. In addition, since the first stack 421 is not uniformly deposited due to a step difference between the first and second fences F1 and F2 and the first to third trenches T1 to T3, at least a portion of the first stack 421 may not be continuous and can be disconnected in the first to third trenches T1 to T3, and in some cases, a portion of the first stack 421 can be continuous within the first to third trenches T1 to T3.

Figure 5C:
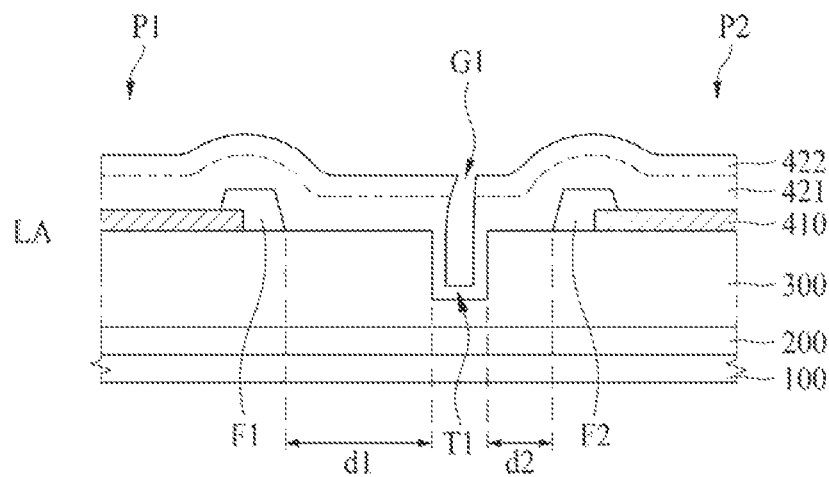
Figure 5C:
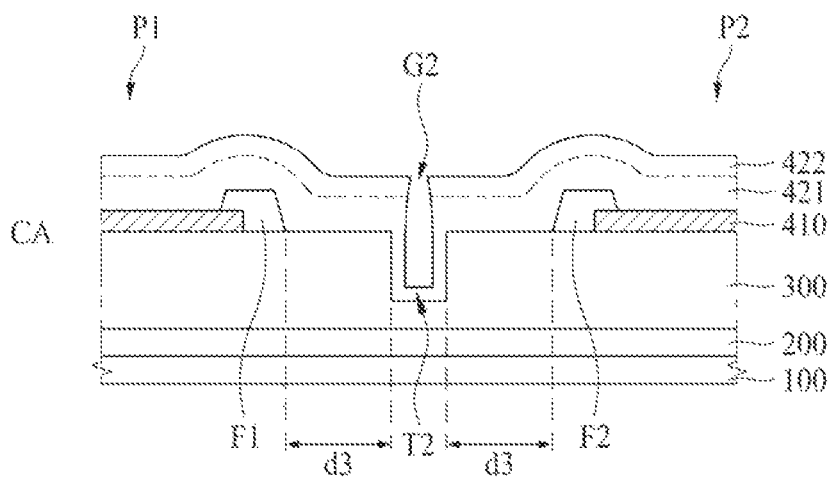
Figure 5C:
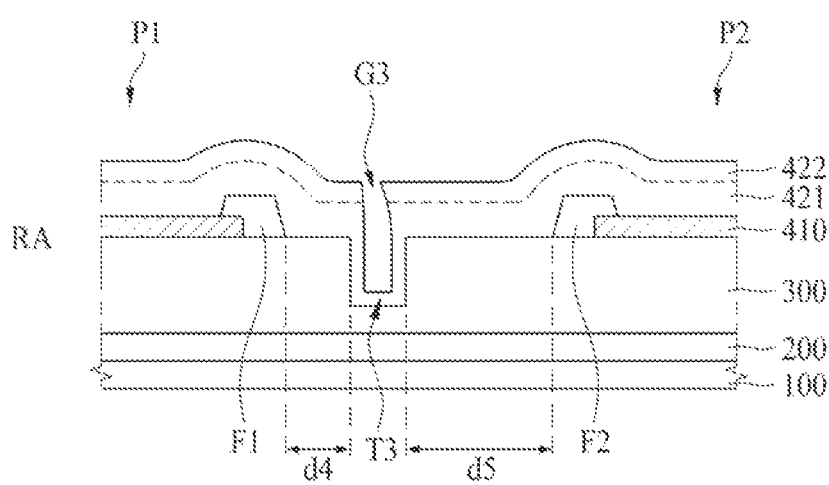

Referring to FIG. 5C, the charge generating layer 422 can be formed on the first stack 421. The charge generating layer 422 can also be formed through a deposition process. Here, as a step increases by a height of the first stack 421, a shadow effect can be further increased, so that a portion of the charge generating layer 422 formed on both sides of the first to third trenches T1 to T3 may not be connected to each other and can be disconnected.

In the left portion LA, since the size of the second interval d2 is less than the size of the first interval d1, the region between the second fence F2 and the first trench T1 and the region between the first fence F1 and the first trench T1 are different in the amount of deposited materials. For example, the amount of material deposited in the region between the first fence F1 and the first trench T1 can be greater than the amount of material deposited in the region between the second fence F2 and the first trench T1. Accordingly, in the region between the first fence F1 and the first trench T1, the material can be deposited so that an area of an upper surface of the charge generating layer 422 is larger than an area of a lower surface of the charge generating layer 422, and in the region between the second fence F2 and the first trench T1, the material can be deposited so that the area of the upper surface of the charge generating layer 422 is less than the area of the lower surface of the charge generating layer 422. Accordingly, the separated region of the charge generating layer 422 can be formed to be bent in the direction of the second fence F2.

In the central portion CA, the first fence F1 and the second fence F2 are formed to be spaced apart by the same interval from the second trench T2, so a height of the charge generating layer 422 formed in the region between the first fence F1 and the second trench T2 and a height of the charge generating layer 422 formed in the region between the second fence F2 and the second trench T2 can be equal. Accordingly, the separated region of the charge generating layer 422 can be formed in a vertical direction.

In the right portion RA, since the size of the fourth interval d4 is less than the size of the fifth interval d5, the region between the first fence F1 and the third trench T3 and the region between the second fence F2 and the third trench T3 are different in the amount of deposited materials. For example, the amount of material deposited in the region between the first fence F1 and the third trench T3 can be less than the amount of material deposited in the region between the second fence F2 and the third trench T3. Accordingly, in the region between the first fence F1 and the third trench T3, the area of the upper surface of the charge generating layer 422 is less than the area of the lower surface of the charge generating layer 422, and in the region between the second fence F2 and the third trench T3, the area of an upper surface of the charge generating layer 422 can be larger than the area of a lower surface of the charge generating layer 422. Accordingly, the separated region of the charge generating layer 422 can be formed to be bent in the direction of the first fence F1.

Figure 5D:
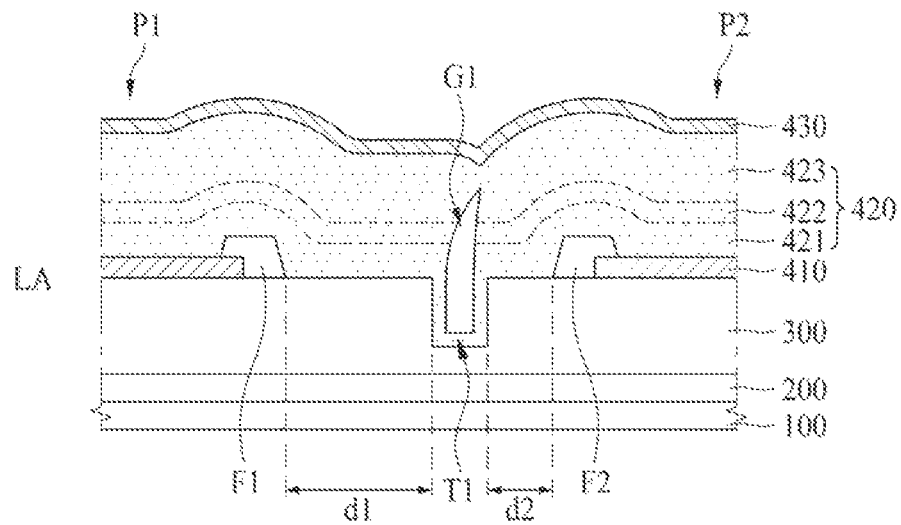
Figure 5D:
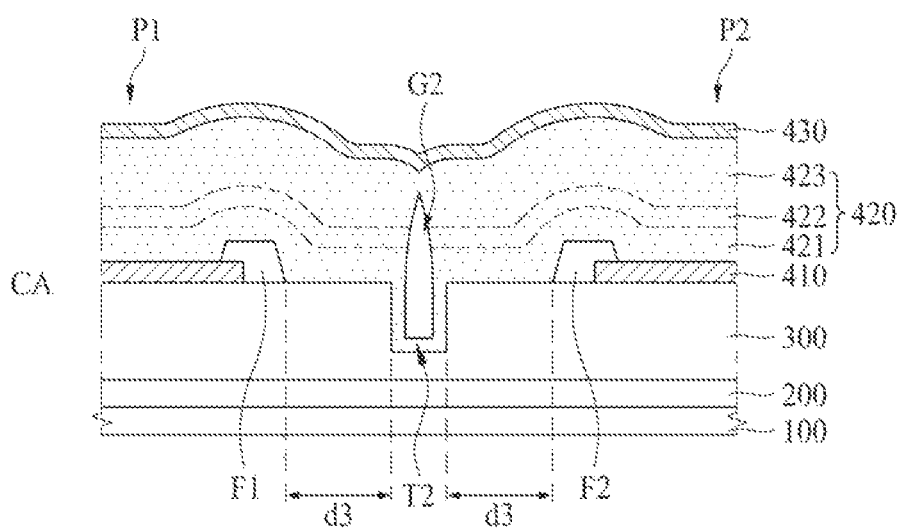
Figure 5D:
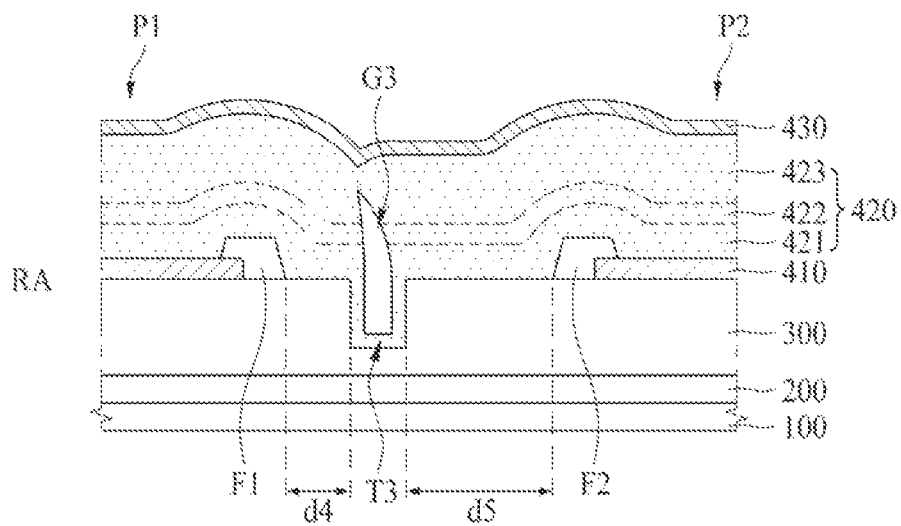

Referring to FIG. 5D, the second stack 423 and the second electrode 430 are formed on the charge generating layer 422.

The second stack 423 can be formed on the charge generating layer 422 and can be formed through a deposition process. Here, a shadow effect is further increased due to the charge generating layer 422, and the second stack 423 is deposited in a separated state on each of the separated surface of the charge generating layer 422 and then contact each other to thereby from first to third gaps G1 to G3 in the first to third trenches T1 to T3.

In the left portion LA, the amount of material deposited in the region between the first fence F1 and the first trench T1 can be gradually increased and the amount of material deposited in the region between the second fence F2 and the first trench T1 can be gradually reduced. Accordingly, the second stack 423 that has been spaced apart and deposited can be in contact on the first trench T1, and the first gap G1 having a width decreasing from the bottom to the top of the first gap G1 can be formed. In addition, the first gap G1 can be formed to be more curved toward the second fence F2.

In the central portion CA, the amount of material deposited in the region between the second fence F2 and the second trench T2 and the amount of material deposited in the region between the first fence F1 and the second trench T2 can be increased to be the same. Accordingly, the second stack 423 that has been spaced apart and deposited can be in contact on the second trench T2 and the second gap G2 having a width decreasing from the bottom to the top of the second gap G2 can be formed. Also, the second gap G2 can be formed in a vertical direction.

In the right portion RA, the amount of material deposited in the region between the first fence F1 and the third trench T3 can be gradually reduced and the amount of material deposited in the region between the second fence F2 and the third trench T3 can be gradually increased. Accordingly, the second stack 423 that has been spaced apart and deposited can be in contact on the third trench T3 and the third gap G3 having a reduced width from the bottom to the top of the third gap G3 can be formed. Also, the third gap G3 can be formed to be more curved toward the first fence F1.

Figure 6:
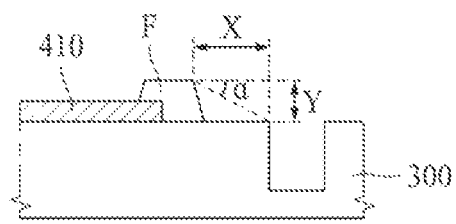
FIG. 6 is cross-sectional views illustrating an insulating layer and a deposition angle of a display apparatus according to an embodiment of the present disclosure.
Figure 6:
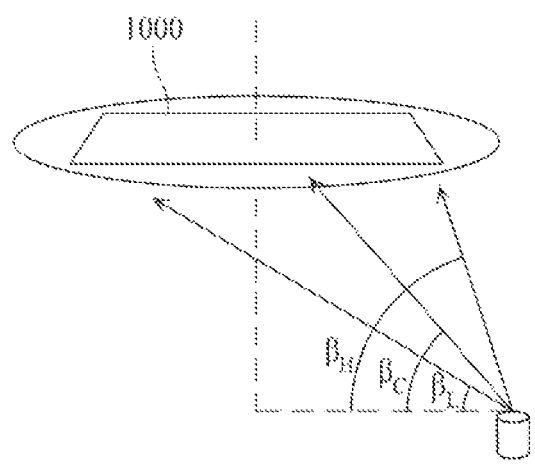

FIG. 6 is cross-sectional views illustrating an insulating layer and a deposition angle of a display apparatus according to an embodiment of the present disclosure.

Particularly, portion (a) of FIG. 6 is a cross-sectional view showing the insulating layer 300 of the display apparatus according to the present disclosure, and portion (b) of FIG. 6 is a cross-sectional view showing a deposition angle. Here, X is a distance from the top of the fence F to an entrance of the trench T, Y is a height between the top of the fence F and the entrance of the trench T, α is an angle of the shadow effect and can also be expressed as $$\tan^{-1}\frac{Y}{X}.$$

In addition, $\beta_L$ denotes a minimum deposition angle, $\beta_C$ denotes a central deposition angle, and $\beta_H$ denotes a maximum deposition angle.

In order to increase the shadow effect, it is preferable to set the value of α to be small, and to this end, it is preferable to increase the value of Y.

As described above and referring to FIG. 6, in the left portion LA and the right portion RA, the curved gap should be formed using the shadow effect, and it is preferable that the shadow effect does not occur in the central portion CA.

To this end, it is preferable that the value of α is greater than the value of $β_L$ and less than the value of $β_C$. For example, the value of $β_L$ can be 50 degrees, and the value of $β_C$ can be 60 degrees.

Figure 7:
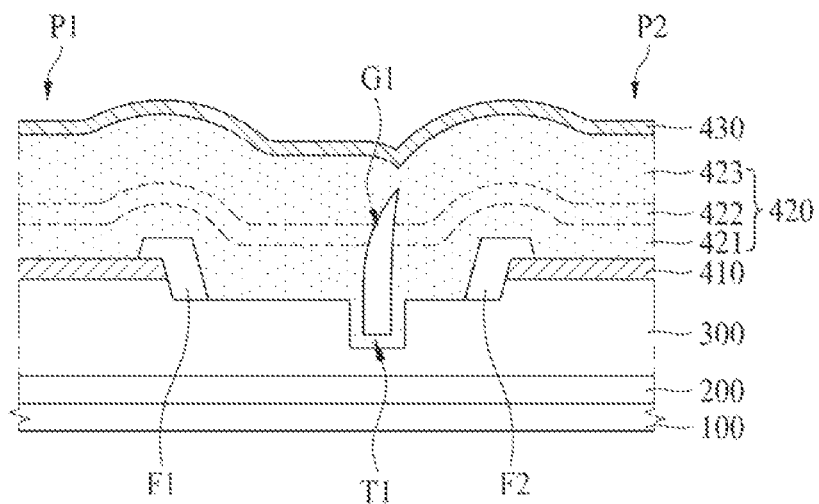
FIG. 7 is across-sectional view illustrating another example of a left portion of a display apparatus according to the present disclosure.
Figure 8:
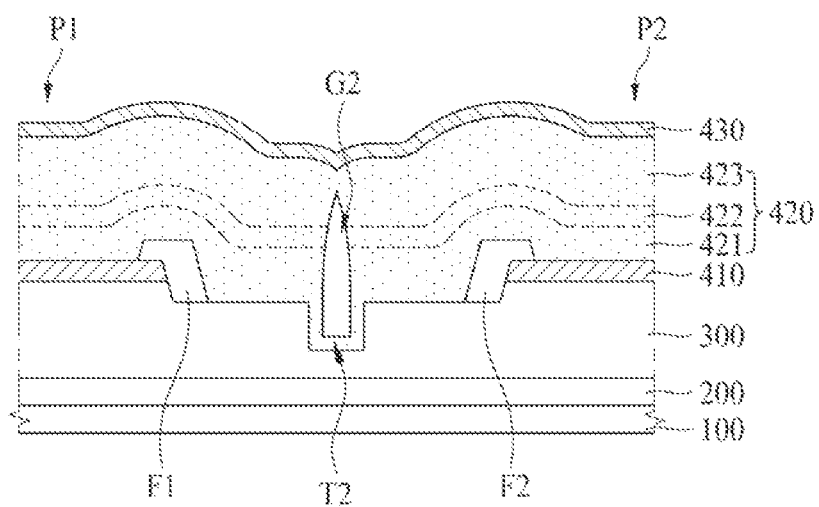
FIG. 8 is a cross-sectional view illustrating another example of a central portion of a display apparatus according to the present disclosure.
Figure 9:
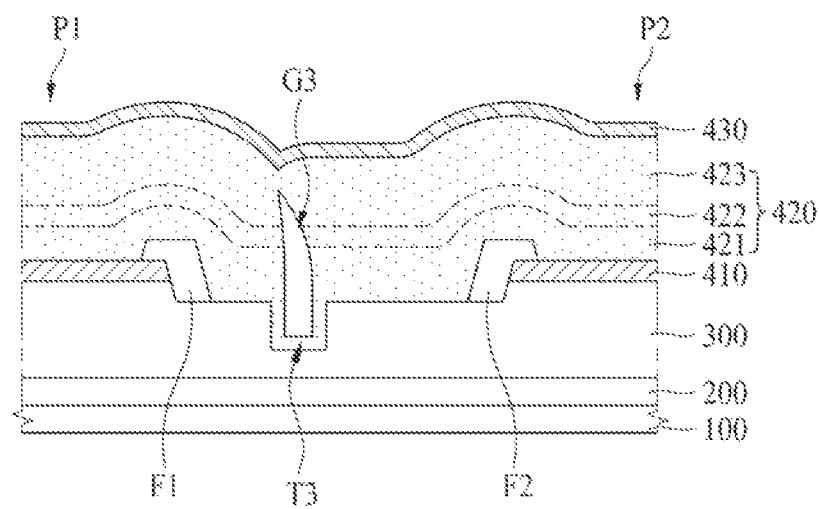
FIG. 9 is a cross-sectional view illustrating another example of a right portion of a display apparatus according to the present disclosure.

FIGS. 7 to 9 are cross-sectional views illustrating other examples of the left portion LA, the central portion CA, and the right portion RA of the display apparatus according to the present disclosure. This is a structure in which the shape of the insulating layer 300 and the first and second fences F1 and F2 is changed in the display apparatus of FIGS. 2 to 4. Hereinafter, only a different configuration will be described or focused.

As described above and referring to FIGS. 7 to 9, a shadow effect increases as the height between the uppermost ends of the first and second fences F1 and F2 and the entrances of the first to third trenches T1-T3 increases. Thus, to this end, the height of the insulating layer 300 provided in the boundary region between the subpixels P1 and P2 can be configured to be less than the height of the insulating layer 300 provided in the two subpixels P1 and P2.

Specifically, in the process of patterning the first electrode 410 provided on the insulating layer 300, the insulating layer 300 provided in the boundary region between the two subpixels P1 and P2 can be etched together to decrease the height of the insulating layer 300. Thereafter, by forming the first and second fences F1 and F2 on the first electrode 410 and the insulating layer 300, the height of the insulating layer 300 provided in the boundary region between the two subpixels P1 and P2 can be reduced.

Figure 10:
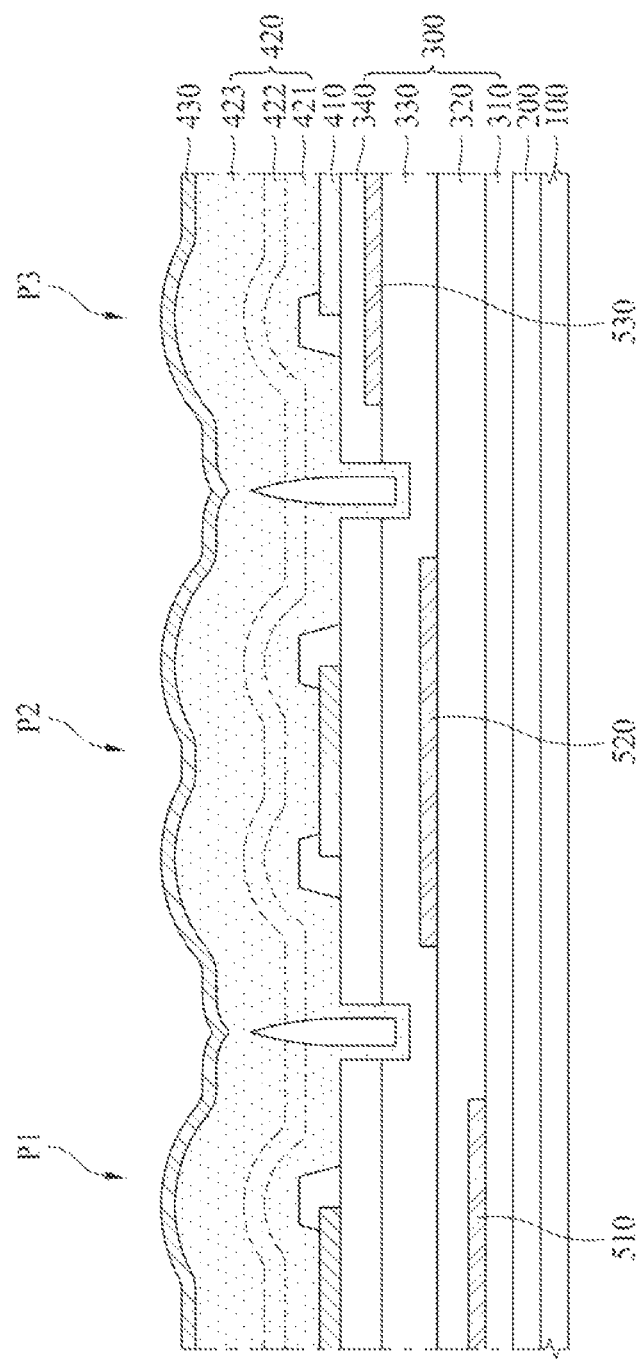
FIG. 10 is a cross-sectional view illustrating another example of a display apparatus according to the present disclosure.

FIG. 10 is a cross-sectional view illustrating another example of a display apparatus according to the present disclosure.

Referring to FIG. 10, a display apparatus according to another example of the present disclosure shows a boundary region between first to third subpixels P1, P2, and P3 and neighboring subpixels.

The insulating layer 300 can include first to fourth insulating layers 310, 320, 330, and 340. A first reflective electrode 510 can be provided on an upper surface of the first insulating layer 310 in the first subpixel region P1, a second reflective electrode 520 can be provided on an upper surface of the second insulating layer 320 in the second subpixel region P2, a third reflective electrode 530 can be provided on an upper surface of the third insulating layer 330 in the third subpixel region P3. Also, the fourth insulating layer 340 can be formed to cover the third reflective electrode 530.

The first to third reflective electrodes 510, 520, and 530 are formed of silver (Ag) or a metal material containing silver (Ag), and reflect light emitted from the light emitting layer 420 in a direction of the second electrode 430.

Also, a distance between the first reflective electrode 510 and the second electrode 430 can be greater than a distance between the second reflective electrode 520 and the second electrode 430, and a distance between the second reflective electrode 520 and the second electrode 430 can be greater than a distance between the third reflective electrode 530 and the second electrode 430. As described above, by forming different distances between the first to third reflective electrodes 510, 520, and 530 and the second electrode 430, light of different colors can be extracted using microcavity characteristics.

Specifically, as the distance between the first to third reflective electrodes 510, 520, and 530 and the second electrode 430 increases, long-wavelength light extraction efficiency can be improved, so that light extraction efficiency of red light from the first reflective electrode 510 and the second electrode 430 can be improved, and also, as the distance between the first to third reflective electrodes 510, 520, and 530 and the second electrode 430 decreases, short-wavelength light extraction efficiency can be improved, so that light extraction efficiency of blue light between the third reflective electrode 530 and the second electrode 430 can be improved. In addition, since the distance between the second reflective electrode 520 and the second electrode 430 is shorter than the distance between the first reflective electrode 510 and the second electrode 430 and longer than the distance between the third reflective electrode 530 and the second electrode 430, light extraction efficiency of green light can be improved.

Accordingly, light extraction efficiency of red light is improved to emit red light in the first subpixel P1, the light extraction efficiency of green light is improved to emit green light in the second subpixel P2, and light extraction efficiency of blue light is improved to emit blue light in the third subpixel P3.

Figure 11A:
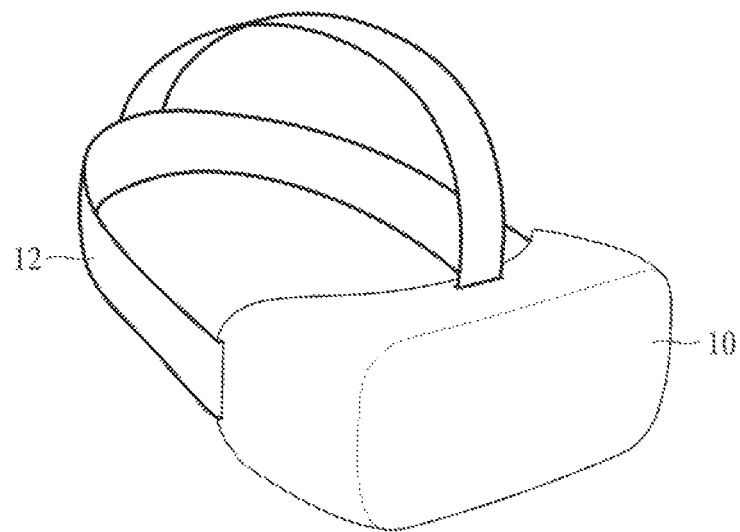
FIGS. 11A to 11C relate to a display apparatus according to an embodiment of the present disclosure, which relates to ahead mounted display (HMD) device.
Figure 11B:
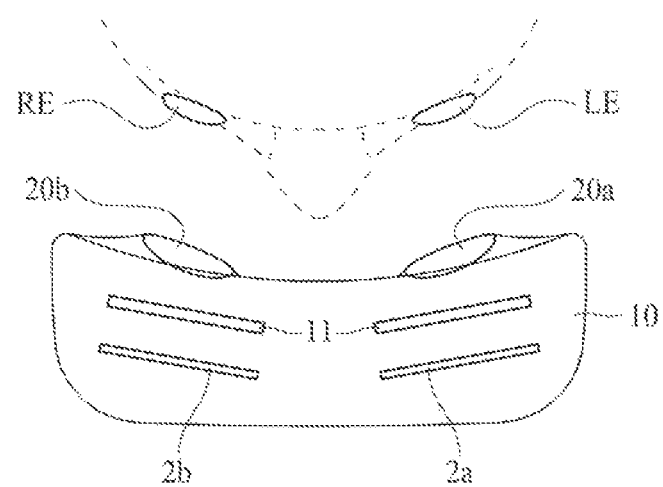
Figure 11C:
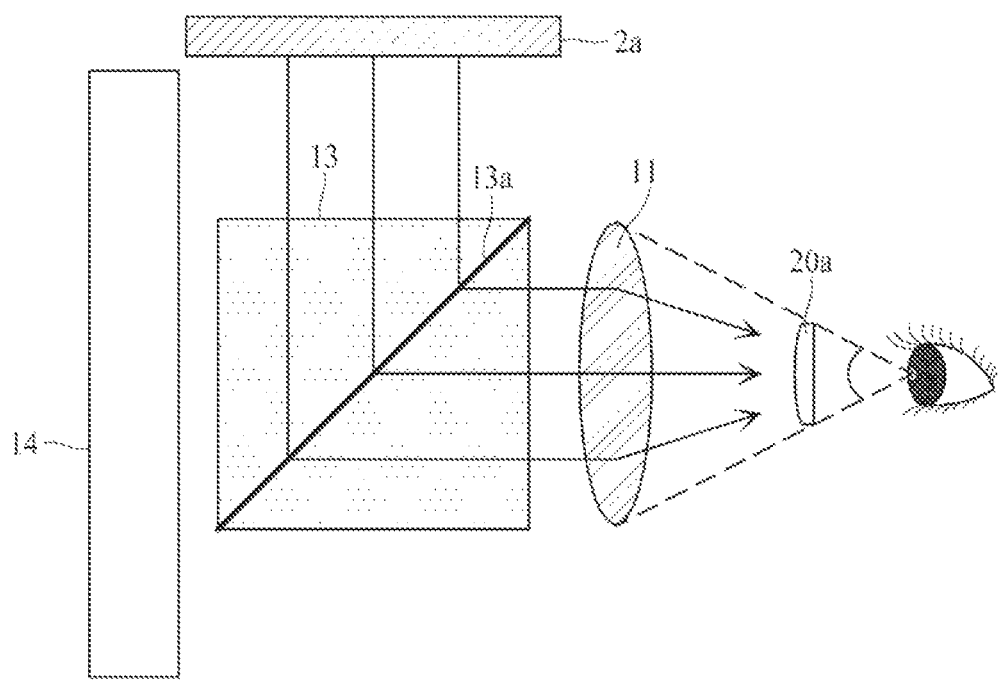

FIGS. 11A to 11C relate to a display apparatus according to another embodiment of the present application, which relates to a head mounted display (HMD) apparatus. All the components of the HMD apparatus are operatively coupled and configured.

Referring to FIG. 11A, the HMD apparatus according to the present application includes a storage case 10 and ahead mounted band 12.

The storage case 10 houses a display apparatus, a lens array, and an eyepiece therein. The head mounted band 12 is fixed to the storage case 10.

The head mounted band 12 is shown to be formed to surround an upper surface and both side surfaces of the user's head, but is not limited thereto. The head mounted band 12 is for fixing the HMD to the user's head, and can be replaced with a structure in the form of glasses frame or helmet.

Referring to FIG. 11B, the HMD apparatus having a virtual reality (VR) structure according to the present disclosure can include a left-eye display apparatus 2a and a right-eye display apparatus 2b, a lens array 11, and a left eyepiece 20a for a left eye (LE) and a right eyepiece 20b for a right eye (RE).

The left-eye display apparatus 2a and the right-eye display apparatus 2b, the lens array 11, and the left eyepiece 20a and the right eyepiece 20b are accommodated in the storage case 10 described above.

The left-eye display apparatus 2a and the right-eye display apparatus 2b can display the same image, and in this case, the user can view a 2D image. Alternatively, the left-eye display apparatus 2a can display a left-eye image and the right-eye display apparatus 2b can display a right-eye image. In this case, the user can view a stereoscopic image. Each of the left-eye display apparatus 2a and the right-eye display apparatus 2b can include the display apparatus described above. For example, each of the left-eye display apparatus 2a and the right-eye display apparatus 2b can be an organic light emitting display.

Each of the left-eye display apparatus 2a and the right-eye display apparatus 2b can include a plurality of subpixels, a circuit element layer 200, an insulating layer 300, a first electrode 410, a light emitting layer 420, and a second electrode 430 and display various images by combining colors of light emitted from each subpixel in various ways.

The lens array 11 can be provided between the left eyepiece 20a and the left eye display apparatus 2a and can be spaced apart from each of the left eyepiece 20a and the left eye display apparatus 2a. For example, the lens array 11 can be located in front of the left eyepiece 20a and behind the left-eye display apparatus 2a. In addition, the lens array 11 can be provided between the right eyepiece 20b and the right eye display apparatus 2b, while being spaced apart from each of the right eyepiece 20b and the right eye display apparatus 2b. For example, the lens array 11 can be positioned in front of the right eyepiece 20b and behind the right eye display apparatus 2b.

The lens array 11 can be a micro lens array. The lens array 11 can be replaced with a pin hole array. Due to the lens array 11, an image displayed on the left-eye display apparatus 2a or the right-eye display apparatus 2b can be enlarged to be seen by the user.

The user's left eye LE can be located in the left eyepiece 20a, and the user's right eye RE can be located in the right eyepiece 20b.

Referring to FIG. 11C, the HMD apparatus having an augmented reality (AR) structure according to the present disclosure includes a left-eye display apparatus 2a, a lens array 11, a left-eye eyepiece 20a, a transmissive reflector 13, and a transmissive window 14. FIG. 11C shows only a left eye configuration for convenience, and a right eye configuration is also the same as the left eye configuration.

The left eye display apparatus 2a, the lens array 11, the left-eye eyepiece 20a, the transmissive reflector 13, and the transmissive window 14 are accommodated in the storage case 10 described above.

The left-eye display apparatus 2a can be disposed on one side, e.g., on an upper side, of the transmissive reflector 13 without blocking the transmissive window 14. Accordingly, the left-eye display apparatus 2a can provide an image to the transmissive reflector 13 without blocking an external background viewed through the transmissive window 14.

The left-eye display apparatus 2a can include the display apparatus described above. Here, an upper portion corresponding to a surface on which an image is displayed faces the transmissive reflector 13.

The lens array 11 can be provided between the left-eye eyepiece 20a and the transmissive reflector 13.

The left eye of the user is located in the left-eye eyepiece 20a.

The transmissive reflector 13 is disposed between the lens array 11 and the transmissive window 14. The transmissive reflector 13 can include a reflective surface 13a that transmits a portion of light and reflects another portion of the light. The reflective surface 13a is formed so that an image displayed on the left-eye display apparatus 2a moves to the lens array 11. Accordingly, the user can view both an external background through the transmissive window 14 and the image displayed by the left-eye display apparatus 2a. For example, since the user can view a single image by overlapping a real background and a virtual image, augmented reality (AR) can be implemented.

The transmissive window 14 is disposed in front of the transmissive reflector 13.

According to the present disclosure, by forming a light emitting layer having a gap, there is an effect of improving light efficiency, while controlling a light path.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a substrate including a left portion, a right portion, and a central portion between the left portion and the right portion, the substrate including a plurality of subpixels provided in each of the left portion, the right portion, and the central portion;
an insulating layer provided on the substrate;
a first electrode provided in each of the plurality of subpixels on the insulating layer;
a first fence and a second fence provided on the insulating layer and covering an end of the first electrode;
a light emitting layer provided on the insulating layer, the first fence, the second fence, and the first electrode;
a second electrode provided on the light emitting layer; and
a trench provided in the insulating layer,
wherein the trench is provided between adjacent subpixels, and is provided between the first fence and the second fence,
wherein the trench includes a first trench provided in the left portion, a second trench provided in the central portion, and a third trench provided in the right portion, and
wherein a distance from the first fence to one end of the first trench is greater than a distance from the second fence to another end of the first trench.

2. The display apparatus of claim 1, wherein the second fence provided on another side of the first trench is located to be closer to the central portion than the first fence provided on one side of the first trench.

3. The display apparatus of claim 1, wherein a first gap is provided inside the light emitting layer in a region overlapping the first trench, and
the first gap has a width decreasing from a bottom to a top of the first gap, and an end of the first gap is bent toward a region in which the second fence is provided.

4. The display apparatus of claim 1, wherein a distance from the first fence to one end of the second trench is equal to a distance from the second fence to another end of the second trench.

5. The display apparatus of claim 4, wherein a second gap is provided inside the light emitting layer in a region overlapping the second trench, and
the second gap has a width decreasing from a bottom to a top of the second gap and is provided in a vertical direction.

6. The display apparatus of claim 1, wherein a distance from the first fence to one end of the third trench is shorter than a distance from the second fence to another end of the third trench.

7. The display apparatus of claim 6, wherein the first fence provided on one side of the third trench is closer to the central portion than the second fence provided on another side of the third trench.

8. The display apparatus of claim 6, wherein a third gap is provided inside the light emitting layer in a region overlapping the third trench,
the third gap has a width decreasing from a bottom to a top of the third gap, and an end of the third gap is bent toward a region in which the first fence is provided.

9. The display apparatus of claim 1, wherein the light emitting layer includes:
a first stack provided on the insulating layer;
a charge generating layer provided on the first stack; and
a second stack provided on the charge generating layer,
wherein the charge generating layer is disconnected in the trench.

10. The display apparatus of claim 1, further comprising:
a first reflective electrode, a second reflective electrode and a third reflective electrode inside the insulating layer.

11. The display apparatus of claim 10, wherein the plurality of subpixels include a first subpixel, a second subpixel and a third subpixel,
the insulating layer incudes a first insulating layer, a second insulating layer and a third insulating layer,
the first reflective electrode is provided on the first insulating layer in a region having the first subpixel,
the second reflective electrode is provided on the second insulating layer in a region having the second subpixel, and
the third reflective electrode is provided on the third insulating layer in a region having the third subpixel.

12. The display apparatus of claim 1, wherein a height of the insulating layer provided in a boundary region between the plurality of subpixels is less than a height of the insulating layer provided in the plurality of subpixels.

13. A display apparatus comprising:
a substrate including a left portion, a right portion, and a central portion between the left portion and the right portion;
a plurality of subpixels including a first subpixel and a second subpixel provided in a same array in each of the left portion, the right portion, and the central portion;
a first trench provided between the first subpixel and the second subpixel provided in the left portion;
a second trench provided between the first subpixel and the second subpixel provided in the central portion; and
a third trench provided between the first subpixel and the second subpixel provided in the right portion,
wherein the first trench is located to be closer to the second subpixel than the first subpixel provided in the left portion,
the second trench is located between the first subpixel and the second subpixel provided in the central portion, and
the third trench is located to be closer to the first subpixel than the second subpixel provided in the right portion.

14. The display apparatus of claim 13, further comprising:
a first gap provided in a region overlapping the first trench;
a second gap provided in a region overlapping the second trench; and
a third gap provided in a region overlapping the third trench,
wherein the first gap, the second gap, and the third gap have different shapes.

15. The display apparatus of claim 14, wherein the first gap has a width decreasing from a bottom to a top of the first gap and an end of the first gap is bent toward the second subpixel.

16. The display apparatus of claim 14, wherein the second gap has a width decreasing from a bottom to a top of the second gap and is provided in a vertical direction.

17. The display apparatus of claim 14, wherein the third gap has a width decreasing from a bottom to a top of the third gap and an end of the third gap is bent toward the first subpixel.

18. The display apparatus of claim 13, further comprising:
a light emitting layer including a first stack, a charge generating layer provided on the first stack, and a second stack provided on the charge generating layer,
wherein the charge generating layer is disconnected in the first trench, the second trench, and the third trench.

19. A display apparatus comprising:
a substrate including a left portion, a right portion, and a central portion between the left portion and the right portion;
a plurality of subpixels including a first subpixel and a second subpixel provided in a same array in each of the left portion, the right portion, and the central portion;
an insulating layer provided on the substrate;
a trench provided in the insulating layer between the first subpixel and the second subpixel;
a light emitting layer provide on the insulating layer, the light emitting layer including a charge generating layer; and
a gap provided in a region overlapping the trench of the light emitting layer, so that the charge generating layer is disconnected at the gap,
wherein, in the left portion and the right portion, the gap is adjacent to any one of the first and second subpixels which is closer to the central portion, and an end of the gap is bent toward the central portion.

* * * * *